(12) United States Patent
Ewe et al.

(10) Patent No.: US 7,524,775 B2
(45) Date of Patent: Apr. 28, 2009

(54) METHOD FOR PRODUCING A DIELECTRIC LAYER FOR AN ELECTRONIC COMPONENT

(75) Inventors: Henrik Ewe, Burglengenfeld (DE); Karl Weidner, München (DE)

(73) Assignee: Infineon Technologies AG, Munich (DE)

(*) Notice: Subject to any disclaimer, the term of this patent is extended or adjusted under 35 U.S.C. 154(b) by 361 days.

(21) Appl. No.: 11/457,318

(22) Filed: Jul. 13, 2006

(65) Prior Publication Data

US 2008/0013249 A1    Jan. 17, 2008

(51) Int. Cl.
*H01L 21/31* (2006.01)
*H01L 21/469* (2006.01)

(52) U.S. Cl. .............. 438/778; 438/622; 438/127; 257/E21.502; 257/E21.503

(58) Field of Classification Search ........... 438/778, 438/622, 127
See application file for complete search history.

(56) References Cited

U.S. PATENT DOCUMENTS

| | | | |
|---|---|---|---|
| 4,783,695 A | 11/1988 | Eichelberger et al. ........ 357/65 |
| 5,139,972 A | 8/1992 | Neugebauer et al. ........ 433/209 |
| 5,291,066 A | 3/1994 | Neugebauer et al. ........ 257/750 |
| 5,449,427 A | 9/1995 | Wojnarowske et al. ...... 156/155 |
| 5,637,922 A | 6/1997 | Fillion et al. ............... 257/728 |
| 5,675,310 A | 10/1997 | Wojnarowske et al. ...... 338/309 |
| 5,875,100 A | 2/1999 | Yamashita ................. 361/764 |
| 6,025,995 A | 2/2000 | Marcinkiewicz ........... 361/760 |
| 6,239,980 B1 | 5/2001 | Fillion et al. ............... 361/760 |
| 6,294,741 B1 | 9/2001 | Cole, Jr. et al. ............ 174/260 |
| 6,306,680 B1 | 10/2001 | Fillion et al. ............... 438/106 |
| 6,396,153 B2 | 5/2002 | Fillion et al. ............... 257/774 |
| 6,541,378 B1 | 4/2003 | Foust et al. ................ 438/687 |
| 6,630,726 B1 | 10/2003 | Crowley et al. ............ 257/666 |
| 6,989,579 B2 | 1/2006 | Yang et al. ................. 257/532 |
| 7,042,074 B2 | 5/2006 | Gölb et al. ................. 257/678 |
| 2006/0192290 A1 | 8/2006 | Seliger et al. ............... 257/774 |

FOREIGN PATENT DOCUMENTS

| | | |
|---|---|---|
| DE | 9109295 U1 | 11/1991 |
| DE | 4438799 A1 | 4/1996 |
| DE | 10004410 A1 | 8/2001 |
| DE | 10308928 A1 | 9/2004 |

(Continued)

OTHER PUBLICATIONS

Liang et al. "Planar Metallization Interconnected 3-D Multi-Chip Module" Electronic Compounds and Technology Conference (pp. 1090-1094), 2003.

(Continued)

*Primary Examiner*—David Zarneke
(74) *Attorney, Agent, or Firm*—Banner & Witcoff, Ltd.

(57) ABSTRACT

A method for producing a dielectric layer extending between two or more elements of an electronic component includes arranging a free-standing dielectric layer above the elements and a deformable support layer below the elements. The free-standing dielectric layer is laminated onto at least a portion of the first surface of the first element and onto at least a portion of the first surface of the second element such that a portion of the dielectric layer extends between the first surface of the first element and the first surface of the second element.

23 Claims, 3 Drawing Sheets

FOREIGN PATENT DOCUMENTS

| | | |
|---|---|---|
| DE | 10314172 A1 | 11/2004 |
| EP | 0987760 A2 | 3/2000 |
| EP | 0611129 B1 | 6/2002 |
| EP | 1230680 B1 | 8/2004 |
| JP | 08115953 | 5/1996 |
| WO | 01/37338 A2 | 5/2001 |
| WO | 03/030247 A2 | 4/2003 |
| WO | 2004/077548 A3 | 9/2004 |

OTHER PUBLICATIONS

Fillon et al. "High Power Density Power Conversion Using Polymer-based Planar Power Packaging" IMAPS Proceedings (7 pages), Sep. 2005.

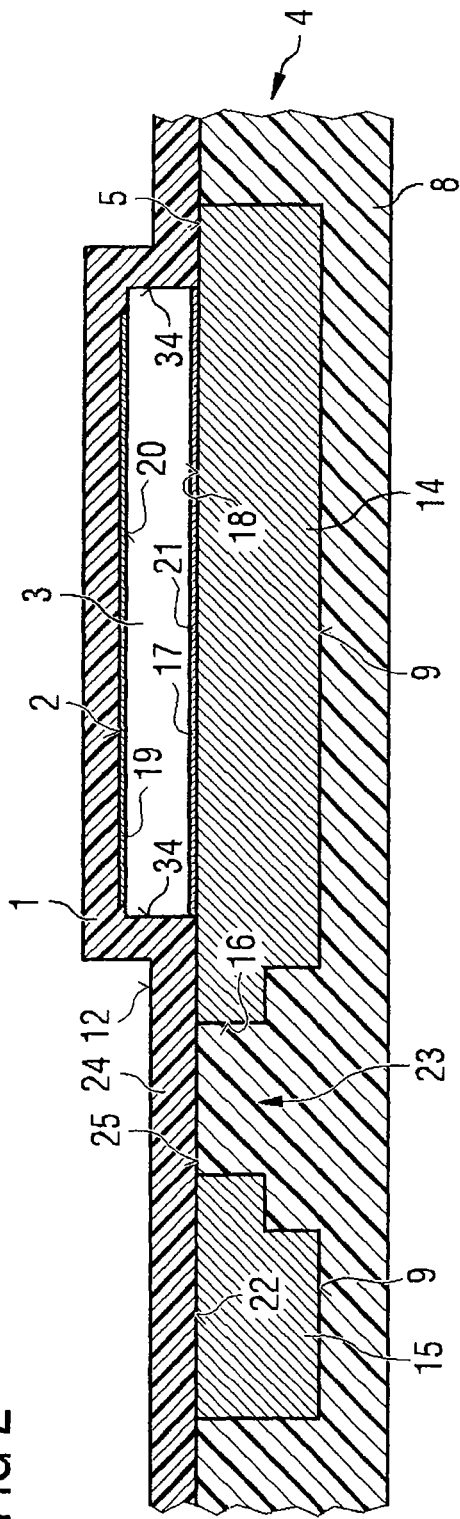
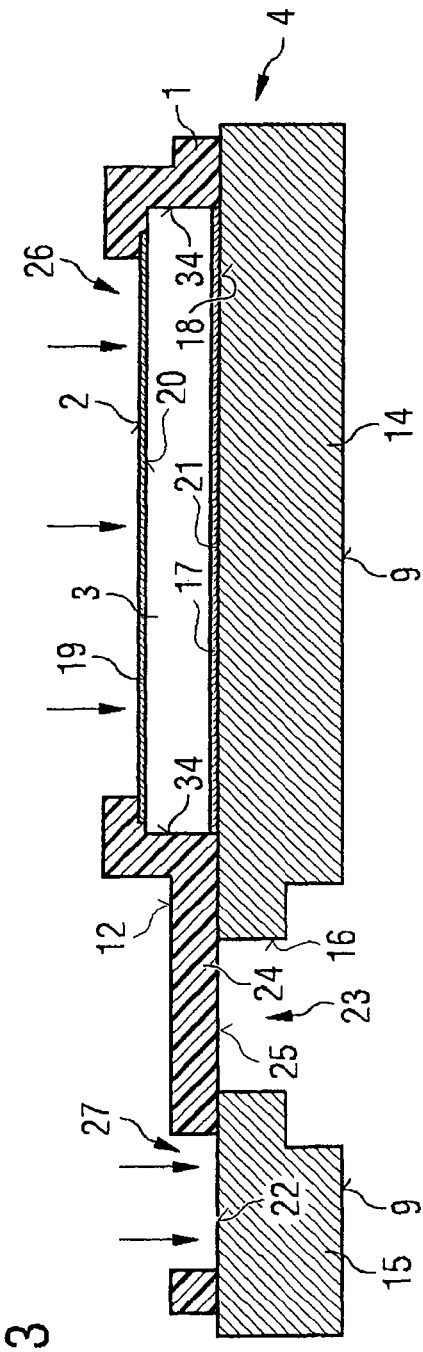
FIG 2
FIG 3

METHOD FOR PRODUCING A DIELECTRIC LAYER FOR AN ELECTRONIC COMPONENT

TECHNICAL FIELD

The application relates to a method for producing a dielectric layer for an electronic component and a method for providing an electrical connection for an electronic component.

BACKGROUND

Electronic components may comprise two or more elements within a package housing which are electrically connected to one another or electrically isolated from one another. For example, a semiconductor chip may be electrically connected to a leadframe or a rewiring substrate by a plurality of electrical connections. However, the electrical connections are electrically isolated from one another to prevent short circuits between them. Electrical connections may be provided by bond wires or solder balls and electrical isolation may be provided by epoxy resin in the form of a plastic package which encapsulates the electrical connections, preventing unwanted short circuits between them. Electronic components may, therefore, comprise both electrically conductive means and electrical isolation means so as to provide the desired arrangement within the component.

For these and other reasons, there is a need for the present invention as set forth in the following embodiments.

SUMMARY

A method for producing a dielectric layer extending between two or more elements of an electronic component may comprise providing a first element of an electronic component, wherein the first element comprises a first surface comprising a first electrically conductive surface and a second surface which opposes the first surface and providing a second element of an electronic component, wherein the second element comprises a first surface comprising a second electrically conductive surface and a second surface which opposes the first surface. The second element can be separate and spaced at a distance from the first element and the second electrically conductive surface can be positioned adjacent the first electrically conductive surface. A free-standing dielectric layer having a lateral extent greater in at least one direction than the distance between the first element and the second element can be provided. A deformable first support layer can be arranged below the second surface of the first element and below the second surface of the second element. The free-standing dielectric layer can be arranged above the first surface of the first element and above the first surface of the second element. The free-standing dielectric layer can be laminated onto at least a portion of the first surface of the first element and onto at least a portion of the first surface of the second element such that a portion of the dielectric layer extends between the first surface of the first element and the first surface of the second element and such that a region of the deformable first support layer is pressed into the space between the first element and the second element. The deformable first support layer can be removed after the dielectric layer is laminated onto at least a portion of the first element and at least a portion of the second element.

BRIEF DESCRIPTION OF THE FIGURES

FIG. 2 illustrates an enlarged view of the electronic component and dielectric layer of FIG. 1, FIG. 3 illustrates structuring the dielectric layer of FIG. 2.

DETAILED DESCRIPTION OF THE FIGURES

Figure 1:
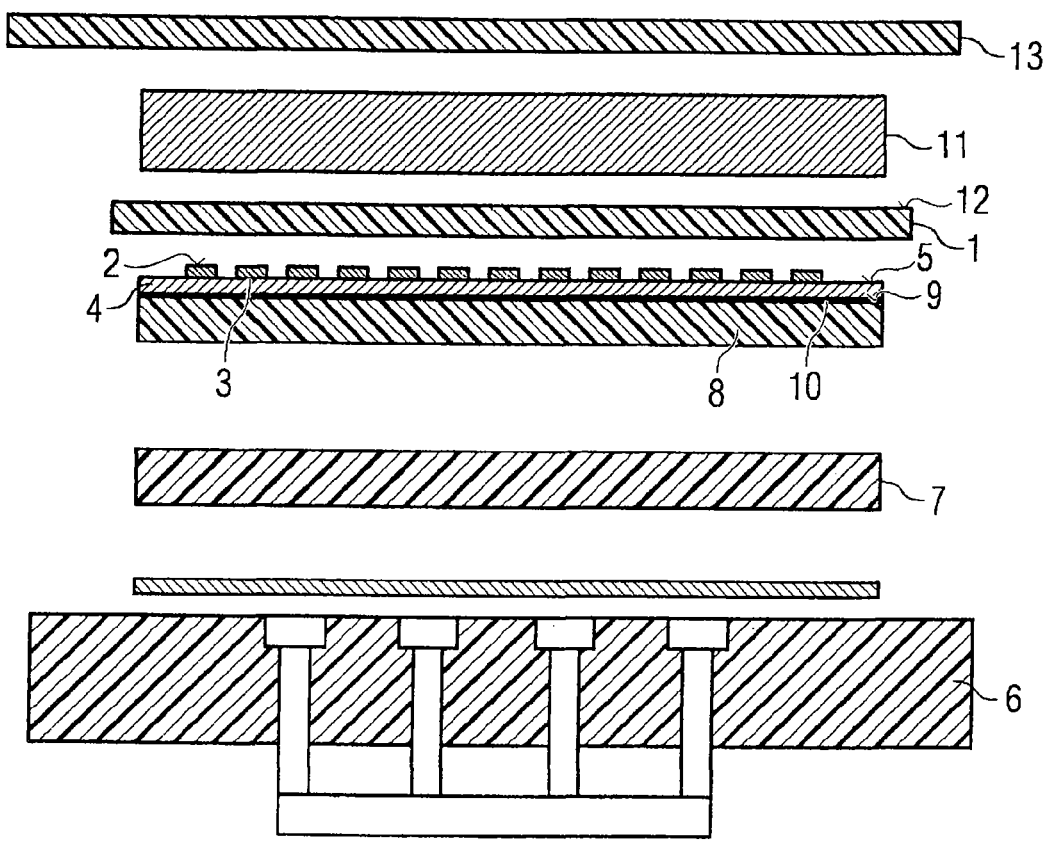
FIG. 1 illustrates a schematic view of an arrangement for applying a dielectric film to elements of an electronic component.

A method for producing a dielectric layer extending between two or more elements of an electronic component may comprise providing a first element of an electronic component. The first element may comprise a first surface comprising a first electrically conductive surface and a second surface which opposes the first surface. A second element of an electronic component can be provided which comprises a first surface comprising a second electrically conductive surface and a second surface which opposes the first surface.

The second element can be separate and spaced at a distance from the first element and the second electrically conductive surface is positioned adjacent the first electrically conductive surface.

A free-standing dielectric layer having a lateral extent greater in at least one direction than the distance between the first element and the second element can be provided.

A deformable first support layer can be arranged below the second surface of the first element and below the second surface of the second element. The free-standing dielectric layer can be arranged above the first surface of the first element and above the first surface of the second element.

The free-standing dielectric layer can be laminated onto at least a portion of the first surface of the first element and onto at least a portion of the first surface of the second element such that a portion of the dielectric layer extends between the first surface of the first element and the first surface of the second element and such that a region of the deformable first support layer is pressed into the space between the first element and the second element.

The deformable first support layer can be removed after the dielectric layer is laminated onto at least a portion of the first element and at least a portion of the second element.

Free-standing is used to denote a dielectric layer which has sufficient mechanical strength to be self-supporting. Examples of a free-standing dielectric layer are a foil or a sheet. Dielectric layers which are deposited onto a surface can be built up in a layer-by-layer fashion to a desired thickness, such as physical and chemical vapor deposited layers, are excluded from this definition.

Laminating is used to denote a process by which a dielectric layer is adhered onto at least regions of the two or more elements of the electronic component. After the lamination process, the dielectric layer can be fixedly attached to these regions.

The method may produce a dielectric layer which extends across a gap between two physically separate elements of an electronic component. The portion of the dielectric layer which bridges this gap may have sufficient mechanical strength to support itself in this gap region. The method process a means by which a dielectric layer may be adhered to two or more elements of an electronic component conformally. The form of the dielectric layer may substantially follow the form of the outer surfaces of the two or more elements.

The method may be used for providing a dielectric layer for a so-called planar rewiring structure as is known from U.S. patent application Ser. No. 11/376,871 which is hereby incorporated by reference in its entirety. An electrically conductive layer comprising one or more conductor tracks may be deposited on the upper surface of the dielectric layer to provide electrical connections between elements of the electronic component. The dielectric layer provides the electrical isolation between the electrically conductive tracks and the elements lying underneath the dielectric layer.

The deformable first support layer can be arranged on the opposing side of the two elements to the side of the two elements on which the dielectric layer is arranged during the lamination process. At least a region of this deformable first support layer can be pressed into the gap between the first and second elements during the lamination process. The deformable first support layer, therefore, may occupy at least some of the space or volume between the first and second elements during the lamination process so that the dielectric layer may not occupy this space. This may enable the form and position of the lower surface of the region of the dielectric layer which is arranged in the gap between the first and second element to be controlled.

If, for example, it is desired that the lower surface of the dielectric layer extends approximately linearly between the first surface of the first element and the first surface of the second element, the first deformable support layer essentially may fill the gap between the first and second element from the second surface of the first and second element up to the first surface of the first and second element during the lamination process. The first deformable support layer and the lower surface of the dielectric layer may be in contact with one another during the lamination process. The first deformable support layer may comprise silicone.

The dielectric layer may extend between the first and second element and may have sufficient strength to support its own weight across this gap after the removal of the first deformable support layer. This regions of the dielectric layer which can be suspended above the gap between the two elements may be through of as a bridge region.

By controlling the form of the lower surface of this region of the dielectric layer which is suspended between the first and second element, the form of the upper surface of this region can also be controlled. A flat or linear upper surface of the dielectric layer may be provided for example. The length of this bridge region of the dielectric layer can be approximately that of the distance between the first and second elements. This may provide an upper surface onto which an electrically conductive layer, such as a metal layer, may be reliably deposited with a uniform thickness.

In an embodiment, a deformable second support layer can be arranged above the free-standing dielectric layer before the lamination process. The deformable second support layer can be pressed onto an upper surface of the dielectric layer during the lamination process and may be removed after the dielectric layer is laminated onto at least a portion of the first element and onto at least a portion of the second element.

The combination of a first deformable support layer positioned on the lower side of the first and second elements and a second deformable support layer positioned on the opposing upper side of the first and second elements may provide an arrangement in which height variations can be accommodated and compensated for. This may enable flat pressing plates, one positioned on the upper surface of the second deformable support layer and one positioned on the lower surface of the first deformable support layer, to be more reliably used to laminate the free-standing dielectric layer onto the first and second elements of the electronic component.

During the lamination of the dielectric layer onto the first element and the second element, one or more of a vacuum and heat may be applied. The vacuum may be applied by means of a vacuum table and may be directed from the lower side of the free-standing dielectric layer and the second surface of the first and second element. The dielectric layer may then be pulled in the direction of the second surface of the first and second element so as to be brought into surface-to-surface contact with at least regions of the first surface of the first and with at least regions of the first surface of the second element. The dielectric layer may be adhered to at least portions of the first surface of the first element and to at least portions of the first surface of the second element as a result of the lamination process.

In an embodiment, at least one cutout can be provided in the free-standing dielectric layer. The arrangement of the cutout or cutouts may correspond to the arrangement of the electrically conductive surfaces. At least a portion of the first electrically conductive surface of the first element of the electronic component and at least a portion of the second electrically conductive surface of the second element of the electronic component can be exposed within the cutouts of the dielectric layer. The cutouts or through-holes in the dielectric layer may expose portions of the electrically conductive surfaces which can then be electrically connected to a further electrically conductive surface.

In an embodiment, the cutouts can be provided in the free-stranding dielectric layer before the lamination process. The cutouts may be provided by a stamping process. In an embodiment, the cutouts can be provided after the dielectric layer is laminated onto the first and second elements. In this case, laser ablation may be used to selectively remove defined regions of the dielectric layer to create through-holes in the dielectric layer. The underlying electrically conductive surface can be exposed within these through-holes.

In an embodiment, the deformable first support layer further may comprise a release layer. At least a portion of the release layer can be positioned in contact with the second surface of the first element and with the second surface of the second element during the lamination process. If the deformable first support layer makes contact with the lower surface of the dielectric layer in the gap between the first element and the second element, the release layer can be in contact with the lower surface of the bridge-portion of the dielectric layer. The release film may be a polymer foil or a polymer film. The release film may be a PTFE (Poly-Tetra-Fluoro-Ethylene) film. The release film may provide an upper surface to the deformable first support layer which fails to adhere to the dielectric layer, the first element and the second element during the lamination process. This may enable the deformable first support layer to be more easily removed after the lamination process. The release layer can also be deformable and may take on the form of the deformable first support layer.

In an embodiment, the deformable second support layer further may comprise a release layer. At least a portion of the release layer can be positioned in contact with the upper surface of the free-standing dielectric layer during the lamination process. The release layer can be positioned between the dielectric layer and the second deformable support layer and may enable the second deformable support layer to be more easily removed from the dielectric layer. The release layer of the second deformable support layer can be itself deformable and may take on the form of the second deformable support layer.

In an embodiment, the first element can be a power semiconductor device and the second element can be one of a portion of a leadframe, a second power semiconductor device and a semiconductor chip. In an embodiment, the dielectric layer may extend between three or more components of an electronic component and a single dielectric layer may extend between two semiconductor power devices and between each of the semiconductor power devices and the leads of a leadframe.

In an embodiment, the first electrically conductive surface can be a load electrode of a semiconductor power device and the second electrically conductive surface can be one of a load electrode of a second semiconductor device, a lead of a leadframe and a die pad of a leadframe. The semiconductor power device may be a diode or a transistor. The device may be either a lateral device or a vertical device.

In an embodiment, the first electrically conductive surface can be a control electrode of a semiconductor power device and the second electrically conductive surface can be one of a lead of a leadframe, a contact pad of a semiconductor chip and a control electrode of a second semiconductor power device.

The first and second semiconductor power devices may be a MOSFET device (Metal Oxide Semiconductor Field Effect Transistor) or an IGBT device (Isolated Gate Bipolar Transistor). In the case of a MOSFET device, the load electrode are named source and drain and the control electrode is named a gate. In the case of an IGBT device, the two load electrodes are named emitter and collector and the control electrode is a gate. The semiconductor power device may be a BJT (Bipolar Junction Transistor).

The dielectric layer may extend between all of the semiconductor devices of the electronic component and from each of the semiconductor devices to the leads and die pad of a leadframe. The dielectric layer may be provided with an arrangement of cutouts or through-holes so that each of the electrodes of the semiconductor devices which it is desired to electrically contact are exposed within the cutouts. Further cutouts can be provided so that regions of each of the leads and one or more regions of the die pad not occupied by semiconductor devices are exposed in these further cutouts or through-holes. These regions can also be electrically contacted. The dielectric layer may have lateral dimensions, after it is laminated onto the various elements of the electronic component, which are essentially the same as or slightly smaller than the lateral dimensions of the electronic component.

In an embodiment, the lateral dimensions of the dielectric layer may be smaller than the lateral dimensions of the electronic component so that the peripheral regions of the leads and die pad of the electronic components remained uncovered by the dielectric layer. These peripheral regions may then be electrically contacted without having to provide cutouts in the dielectric layer.

Electrical connections may then be provided between the exposed electrically conductive contact surfaces of the elements of the electronic component in order to produce an electronic component with the desired function.

The application also provides a method of producing an electrical connection between at least two elements of an electronic component. The method may comprise a method according to one of the embodiments previously described to produce a dielectric layer which extend between two or more elements of electronic component. After the dielectric layer has been laminated onto at least a portion of the first surface of the first element and at least a portion of the second element, an electrically conductive layer may be deposited onto the upper surface of the dielectric layer. The electrically conductive layer may extend between, and electrically connects, the first electrically conductive surface of the first element and the second electrically conductive surface of the second element.

A planar interconnection structure within an electronic component may be provided by the dielectric layer and electrically conductive conductor tracks may be deposited on top of the dielectric layer. The dielectric layer may provide an electrical isolation layer which extends over the whole the upper surfaces of the elements positioned within the electronic component with the exception of the regions which are to be electrically connected. This provides an upper surface onto which the electrically conductive conductor tracks may be provided which have the desired form to provide tracks with the desired electrical conductivity and to provide the desired rewiring structure. Since the form of the dielectric layer which bridges the gaps between physically separate elements of the electronic component is controlled by the first deformable support layer during the lamination process, the thickness and length of the conductor tracks deposited on the top can be more uniform.

The electrically conductive layer may be fabricated by depositing a first seed layer by a vacuum deposition technique such as physical vapour deposition or chemical vapour deposition technique. Sputtering, laser ablation, election beam evaporation or thermal evaporation may be used. A second layer may then be deposited on the first seed layer by a galvanic technique as the first seed layer provides a sufficiently electrically conductive surface. The second layer may be deposited on the first seed layer by a currentless galvanic deposition technique.

The use of a vacuum deposited seed layer followed by a second layer deposited by galvanic deposition may provide an electrically conductive layer with good adhesion to the dielectric layer and which can be simply and cost-effective lead manufactured.

In an embodiment, the electrically conductive layer may be provided by a single layer of metal or a single layer of an alloy. The single layer may be deposited by a vacuum deposition technique such as sputtering.

The electrically conductive layer may be structured to provide a plurality of electrically conductive tracks on the upper surface of the dielectric layer. The plurality of electrically conductive tracks can be electrically isolated from each other as they are spaced at a distance from each other and surrounded by regions of the dielectric layer. The plurality of electrically conductive tracks may be arranged to provide the desired rewiring arrangement between the elements of the electronic component.

In an embodiment, the plurality of electrically conductive tracks can be produced by selective deposition. In a further embodiment, the plurality of electrically conductive tracks can be produced by depositing a closed electrically conductive layer and then structuring the electrically conductive layer to produce physically separate tracks.

The application also relates to a method of producing an electronic component. At least one semiconductor power transistor can be provided which comprises a first surface comprising at least one load electrode and a second surface which opposes the first surface. A leadframe can be provided which comprises a first surface and a second surface which opposes the first surface. The leadframe may comprise at least one die pad and at least one lead, the lead comprising a second electrically conductive surface. The lead can be positioned separate from and spaced at a distance from the die pad. A free-standing dielectric layer can be provided which has a lateral extent greater in at least one direction than the distance between the first load electrode of the semiconductor power transistor and the second electrically conductive surface of the lead.

The second surface of the first semiconductor power transistor can be mounted on the first surface of the die pad. A deformable first support layer can be arranged below the second surface of the die pad and the second surface of the lead and the free-standing dielectric layer is arranged above the first load electrode of the semiconductor power transistor and above the second electrically conductive surface of the lead.

The free-standing dielectric layer can be laminated onto at least a portion of the first surface of the semiconductor power transistor and at least a portion of the first surface of the lead such that a portion of the dielectric layer extends between the first surface of the semiconductor power transistor and the first surface of the lead and such that the deformable second support layer is pressed into the space between the first semiconductor power transistor and the lead.

The deformable first support layer can be removed after the dielectric layer is laminated onto at least a portion of the first element and onto at least a portion of the second element. At least a portion of the first load electrode and at least a portion of the second electrically conductive surface of the lead may remain exposed from the dielectric layer. An electrically conductive layer can be deposited onto the upper surface of the free-standing dielectric layer, the electrically conductive layer extending between and electrically connecting the first load electrode of the semiconductor power transistor and the lead of the leadframe. The semiconductor power transistor and the lead may be embedded in a plastic encapsulation mass so that the lower surface of the portion of the dielectric layer extending between the semiconductor power transistor and the lead is embedded in the plastic encapsulation mass.

The dielectric layer extending between the semiconductor power transistor and the lead may be produced according to one of the embodiments previously described.

In an embodiment, the semiconductor power transistor further may comprise at least one control electrode positioned on the first surface which is exposed from the dielectric layer. The dielectric layer further may extend between the first surface of the semiconductor power transistor and a second lead which is the control lead of the electronic component.

The semiconductor power transistor may be a lateral device or a vertical device. In an embodiment, the semiconductor power device may be a vertical MOSFET device or a vertical IGBT device.

In an embodiment, the electrically conductive layer may provide a plurality of electrically conductive tracks on the upper surface of the dielectric layer. The plurality of electrically conductive tracks can be physically separate and electrically isolated from one another. A first electrically conductive track may extend between one or more load leads and the load electrode and a second electrically conductive track may extend between the control electrode and a control lead. The first and second electrically conductive tracks can be physically separate and electrically isolated from one another by regions of the dielectric layer. The electrically conductive layer may comprise a metal or an alloy and may be deposited according to one of the embodiments previously described.

In an embodiment, two semiconductor power transistors may be provided, each having a first surface comprising at least one load electrode and a second surface which opposes the first surface. The dielectric layer is laminated onto at least a portion of the first surface of both of the two semiconductor power transistors and the electrically conductive layer is structured to electrically connect the two semiconductor power transistors and the leadframe so as to provide a half-bridge circuit.

In an embodiment, at least one further semiconductor chip can be provided, the semiconductor chip having a first surface comprising a plurality of contact pads and a second surface which opposes the first surface. The dielectric layer can be laminated onto at least portions of the first surface of the semiconductor chip and the electrically conductive layer can be structured so as to provide electrically conductive tracks between the contact pads of the semiconductor chip and at least one of a control electrode of the semiconductor power transistor and a lead of the leadframe. Each of the electrically conductive tracks can be physically separate and electrically isolated from the other conductor tracks.

The semiconductor chip may be an integrated circuit device and may be a control chip such as a gate driver chip.

FIG. 1 illustrates schematic arrangement for applying a dielectric layer 1 to the upper surface 2 of a plurality of semiconductor devices 3 arranged on a leadframe strip 4. In this embodiment, the dielectric layer 1 is a polymer film 1.

The arrangement may be used to provide a dielectric layer for use in a planar rewiring structure which is suitable for electronic components including power semiconductor components. Such planar rewiring structures and electronic components including them are known from U.S. patent application Ser. No. 11/376,871 which is hereby incorporated by reference in its entirety.

The polymer film 1 is applied to the upper surface 2 of the plurality of semiconductor devices 3 and to the upper surface 5 of the leadframe strip 4 by means of a vacuum technique. The arrangement includes a vacuum table 6 on which a base plate 7 is arranged. A deformable first support layer 8 is arranged between the base plate 7 and leadframe strip 4. The first deformable layer 8 also includes a release film 10 which, during the lamination process, is positioned in contact with the lower surface 9 of the leadframe strip 4. The release layer 10 enables the first deformable layer 8 to be more easily removed from the lower surface 9 of the leadframe strip 4 after the polymer film 1 has been laminated to the upper surface 2 of the semiconductor devices 3.

The polymer film 1 is arranged above the upper surface 2 of the semiconductor devices 3 and above the upper surface 5 of the leadframe strip 4. In this embodiment, a second deformable support layer 11 is arranged above the upper surface 12 of the polymer film 1 which provides the dielectric layer. In an embodiment not illustrated in the figures, the second deformable support layer 11 is omitted from the arrangement. A vacuum seal 13 is arranged above the second deformable support layer 11.

The stacked arrangement enables polymer film 1 to be laminated onto at least the upper surface 2 of the plurality of semiconductor devices 3. The arrangement and function of the first support layer 8 and the method by which the polymer film 1 is laminated onto the semiconductor devices 3 is explained in more detail with reference to FIG. 2.

FIG. 2 illustrates a single device position of the leadframe strip 4 of FIG. 1 in cross-section. In this embodiment, each device position of the leadframe strip 4 provides a die pad 14 and a plurality of leads 15 arranged adjacent one side face 16 of the die pad 14. The leads 15 are spaced at a distance from the side face 16 of die pad 14.

A semiconductor device 3 which, in this embodiment, is a power MOSFET transistor is mounted onto the upper surface 5 of the die pad 14. The power MOSFET transistor 3 is a vertical device and comprises a drain electrode 17 on the lower surface 18 and a source electrode 19 and a gate electrode, which cannot be seen in the cross-sectional view of FIG. 2, on its upper surface 20. In this embodiment, the drain electrode 17 is attached to the upper surface 5 of the die pad 14 by a diffusion solder bond 21.

The polymer film 1 is applied to at least the upper surface 2 of the MOSFET device 3, the upper surface 5 of the die pad 14 and the upper surface 22 of the lead 15 using a vacuum arrangement shown in FIG. 1. The polymer film 1 is laminated onto the upper surface 2 and side faces 34 of the MOSFET device 3, the upper surface 5 of the die pad 14 and the upper surface 22 of the lead 15 by applying a vacuum and by applying heat and pressure for a time suitable to adhere the polymer film 1 to the power MOSFET device 3 and leadframe strip 4. During the lamination process by which the polymer film 1 is laminated onto the upper surface 2 and side surfaces 34 of the MOSFET device 3, upper surface 5 of the die pad 14 and upper surface 22 of the lead 15, the first deformable support layer 8 is positioned on the opposing lower side 9 of the leadframe strip 4. The release film 10 is not illustrated in FIG. 2 for clarity. The first deformable support layer 8 comprises a silicone foil. The first deformable support layer 8 is sufficiently flexible that it is able to be pushed into the spaces 23 between the leads 15 and the die pad 14. The first deformable support layer 8 provides a structure which prevents the region 24 of the polymer layer 1 which extends across the gap 23 between the leads 15 and die pad 14 from sagging excessively into the gap 23.

This arrangement enables a dielectric layer 1 to be provided which, after the removal of the first support layer 8, is self-supporting in the region 24 which extends across the gap 23 and which has lower surface 25 which is substantially coplanar with the upper surface 22 of the lead 15 and the upper surface 5 of the die pad 14. Consequently, the upper surface 12 of the polymer film 1 is also free of depressions caused by sagging of the polymer film in the gap 23.

The polymer film 1 may then be structured as illustrated in FIG. 3. A plurality of cutouts or through holes 26 are then created in the polymer film 1 to expose the source electrode 19 and gate electrode on the upper surface of the MOSFET device 3 and a region of the upper surface 22 of the leads 15 so that an electrical connection can be made to these exposed regions. After it has been laminated onto the upper surface 2 and side surfaces 34 of the MOSFET device 3 and upper surface 22 of the lead 15, the polymer film 1 may be selectively removed using laser ablation as illustrated by the arrows in FIG. 2. The source electrode 19 is, therefore, positioned within the first through hole 26 and the gate electrode is exposed within a separate cutout in the polymer film 1. The second cutout for the gate electrode cannot be seen in the cross-sectional view of FIG. 3. A third through hole 27 which exposes a region of the upper surface 22 of the lead 15 is shown in the cross-sectional view of FIG. 3.

In a further embodiment, not illustrated in the Figures, the polymer film is provided with a plurality of cutouts of through-holes before it is laminated onto the semiconductor devices. The cutouts may be provided by stamping out regions of the polymer film. The size and arrangement of these regions corresponds to the size and arrangement of the surfaces of the elements of the electronic component it is desired to expose.

Electrical connections between the source electrode 19 and gate electrode positioned on the upper surface of the MOSFET device 3 and the leads 15 are produced by depositing electrically conductive metal layer on to the upper surface 12 of the polymer film 1 and the exposed regions of the source electrode 19, gate electrode and leads 15. The completed rewiring structure is illustrated in FIG. 4.

Figure 4:
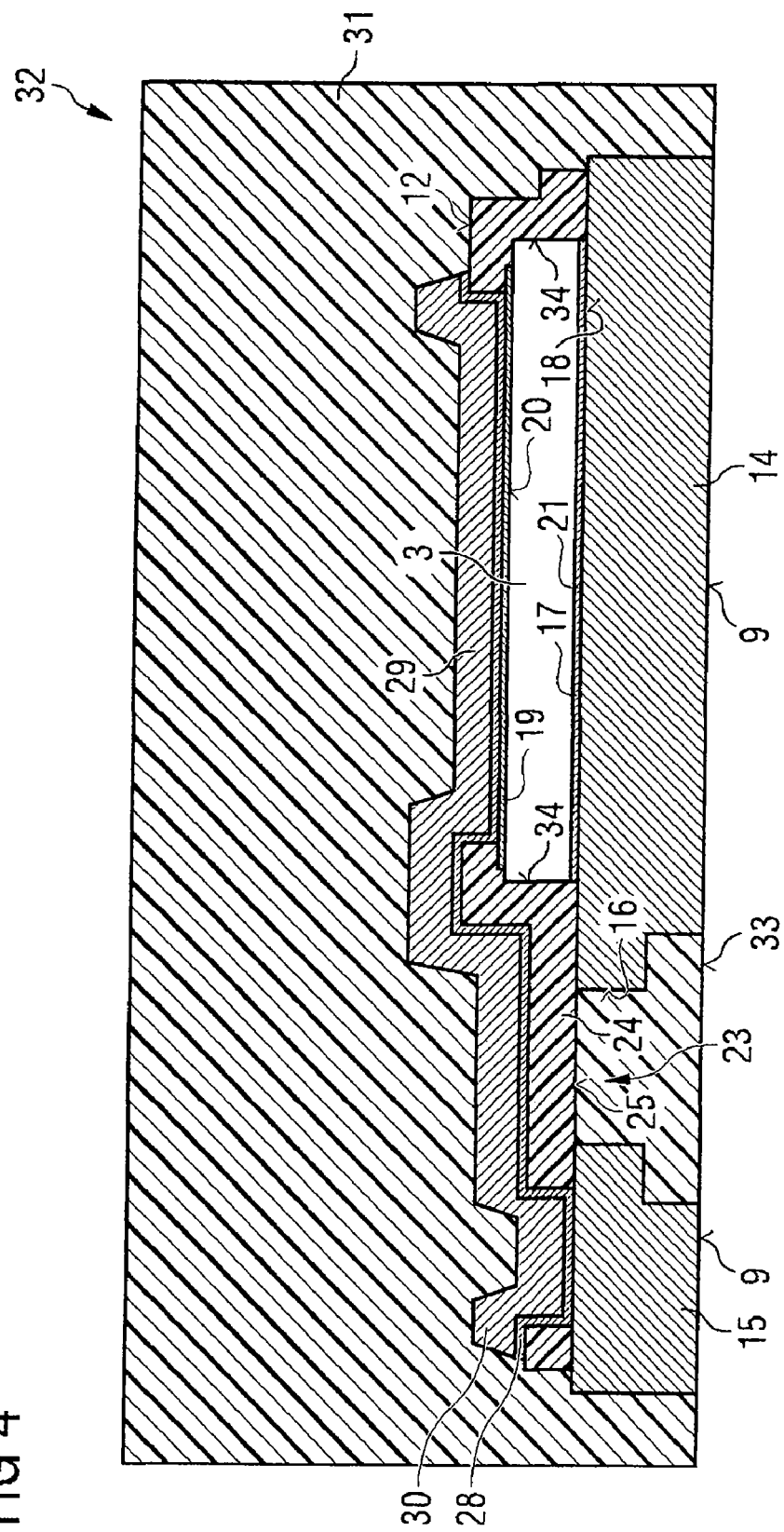
FIG. 4 illustrates the electronic component after the electrical connections have been made between the elements illustrated in FIG. 3.

FIG. 4 illustrates that the electrical connections are produced by first depositing a seed layer 28 onto the upper surface 12 of the polymer film 1 and onto the exposed regions of the lead 15, the source electrode 19 and gate electrode which are exposed in the cutouts 26 of the polymer film 1. The seed layer 28 is deposited by a vacuum deposition process such as sputtering. The seed layer 28 is then structured to produce physically separate conductor tracks 29 between the electrodes of the MOSFET device 3 and leads 15.

If the electronic component comprises a single transistor device 3, then two physically separate conductor tracks 29 are provided, one from the source electrode to a source lead or leads 15 and one from the gate electrode to the gate lead. The lateral area of the conductor tracks may be selected depending on the current carrying capacity which is desired for the track. The conductor track electrically connecting the gate electrode to the gate lead may be laterally much smaller than the conductor track 29 electrically connecting the source electrode 19 to the source lead 15 for example.

The thickness of the conductor tracks 29 may be increased by depositing a second layer 30 onto the structured seed layer 28. The second layer 30 of the conductor tracks 29 may be deposited by a galvanic deposition process and may be deposited by a currentless galvanic deposition process. The seed layer 28 may comprise Ti and the second layer 30 may comprise copper.

If it is desired to provide conductor tracks 29 of different thicknesses, this may be provided by depositing further metal layers onto selected conductor tracks. A photoresist layer may be deposited onto the conductor tracks already formed and structured to expose the conductor tracks whose thickness it is desired to increase. A further metallic layer or layers may then be deposited by a selective deposition process or by deposition and further structuring of the deposited metal layers to increase the thickness of the conductor tracks.

After the electrical connections have been made between the semiconductor device 3 and the leads 15 by the deposition of the conductor tracks 29, a mold transfer process may be carried out to encapsulate the elements of the device positions of the leadframe strip 4 to produce the electronic components. The portion 24 of the polymer film 1, which extends between the die pad 14 and the lead 15, has a lower surface 25 which is substantially planar and substantially coplanar with the upper surface 5 of the die pad 14 and the upper surface 22 of the lead 15. The encapsulation compound 31 is able to more reliably flow into the gaps 23 between the leads 15 and the die pad 14. The thickness of the encapsulation compound in these gap regions 23 is also more uniform across the electronic component 32 which produces a more reliable electrical isolation of the electrically conductive elements of the electronic component.

As can be seen in FIG. 4, the electronic component 32 is a leadless package and the lower surfaces 9 of the die pad 14 and lead 15 are exposed in the lower surface 33 of the electronic component 32. After the encapsulation process, these exposed surfaces 9, which provide the outer contact surfaces of the electronic component 32, are cleaned and may be tin-plated. The individual electronic components 32 are then singulated from the leadframe strip 4.

The method is illustrated with reference to the figures for an electronic component 32 which comprises a single MOSFET device 3 and two conductor tracks 29 which extend between the source electrode and gate electrode of the vertical MOSFET device 3 and leads 15 of the electronic component 32. However, the method to laminate the polymer film 1 and the method by which the conductor tracks are deposited and the electronic component are fabricated may also be used for electronic components which comprise two or more semiconductor power transistors and to provide electronic connections between the two semiconductor power transistors or between the upper surface of the semiconductor power transistor semiconductor power transistor and a region of the die pad.

The method of the application may be used in the fabrication of multi-chip modules and may be used in the fabrication of an electronic component providing a half-bridge circuit.

REFERENCE NUMBERS 1 dielectric layer
2 upper surface
3 MOSFET device
4 leadframe strip
5 upper surface of leadframe strip
6 vacuum table
7 base plate
8 first deformable support layer
9 lower surface of leadframe strip
10 release film
11 second deformable support layer
12 upper surface of dielectric layer
13 vacuum seal
14 die pad
15 lead
16 side face of die pad
17 drain electrode
18 lower surface of MOSFET device
19 source electrode
20 upper surface of MOSFET device
21 diffusion solder bond
22 upper surface of lead
23 gap
24 bridging portion of dielectric layer
25 lower surface of dielectric layer
26 through hole
27 second through hole
28 seed layer
29 conductor track
30 second layer of conductor track
31 encapsulation compound
32 electronic component
33 lower surface of electronic component
34 side face of MOSFET device

What is claimed is:

1. A method for producing a dielectric layer extending between two or more elements of an electronic component, the method comprising:
    providing a first element of an electronic component, wherein the first element comprises a first surface comprising a first electrically conductive surface and a second surface which opposes the first surface;
    providing a second element of an electronic component, wherein the second element comprises a first surface comprising a second electrically conductive surface and a second surface which opposes the first surface, wherein the second element is separate and spaced at a distance from the first element and wherein the second electrically conductive surface is positioned adjacent the first electrically conductive surface;
    providing a free-standing dielectric layer having a lateral extent greater in at least one direction than the distance between the first element and the second element;
    arranging a deformable first support layer below the second surface of the first element and below the second surface of the second element;
    arranging the free-standing dielectric layer above the first surface of the first element and above the first surface of the second element;
    laminating the free-standing dielectric layer onto at least a portion of the first surface of the first element and onto at least a portion of the first surface of the second element such that a portion of the dielectric layer extends between the first surface of the first element and the first surface of the second element and such that a region of the deformable first support layer is pressed into the space between the first element and the second element, and
    removing the deformable first support layer after the dielectric layer is laminated onto at least a portion of the first element and at least a portion of the second element.

2. A method according to claim 1, wherein
a deformable second support layer is arranged above the free-standing dielectric layer before the lamination process, the deformable second support layer being pressed onto an upper surface of the dielectric layer during the lamination process and being removed after the dielectric layer is laminated onto at least a portion of the first element and at least a portion of the second element.

3. A method according to claim 1, wherein
the deformable first support layer is pressed into the space between the first element and the second element and makes contact with a lower surface of the portion of the free-standing dielectric layer extending between the first element and the second element.

4. A method according to claim 1, wherein
one or more of a vacuum and heat are applied during the lamination of the dielectric layer onto the first element and the second element.

5. A method according to claim 1, wherein
at least one cutout is provided in the free-standing dielectric layer, the arrangement of the cutout corresponding to the arrangement of the electrically conductive surfaces and at least a portion of the first electrically conductive surface and at least a portion of the second electrically conductive surface are exposed within the cutouts.

6. A method according to claim 1, wherein
the cutouts are provided in the free-stranding dielectric layer before the lamination process.

7. A method according to claim 1, wherein
the cutouts are provided after the dielectric layer is laminated onto the first and second elements.

8. A method according to claim 1, wherein
the deformable first support layer further comprises a release layer, wherein at least a portion of the release layer is positioned in contact with the second surface of the first element and with the second surface of the second element during the lamination process.

9. A method according to claim 2, wherein
the deformable second support layer further comprises a release layer, wherein at least a portion of the release layer is positioned in contact with the upper surface of the free-standing dielectric layer during the lamination process.

10. A method according to claim 1, wherein
the first element is a power semiconductor device and the second element is one of a portion of a leadframe, a second power semiconductor device and a semiconductor chip.

11. A method according to claim 1, wherein
the first electrically conductive surface is a load electrode of a semiconductor power device and the second electrically conductive surface is one of a load electrode of a second semiconductor device, a lead of a leadframe and a die pad of a leadframe.

12. A method according to claim 1, wherein
the first electrically conductive surface is a control electrode of a semiconductor power device and the second electrically conductive surface is one of a lead of a leadframe, a contact pad of a semiconductor chip and a control electrode of a second semiconductor power device.

13. A method of providing an electrical connection between at least two elements of an electronic component, the method comprising:
   providing a first element of an electronic component, wherein the first element comprises a first surface comprising a first electrically conductive surface and a second surface which opposes the first surface;
   providing a second element of an electronic component, wherein the second element comprises a first surface comprising a second electrically conductive surface and a second surface which opposes the first surface, wherein the second element is separate and spaced at a distance from the first element and wherein the second electrically conductive surface is positioned adjacent the first electrically conductive surface;
   providing a free-standing dielectric layer having a lateral extent greater in at least one direction than the distance between the first element and the second element;
   arranging a deformable first support layer below the second surface of the first element and below the second surface of the second element;
   arranging the free-standing dielectric layer above the first surface of the first element and above the first surface of the second element;
   laminating the free-standing dielectric layer onto at least a portion of the first surface of the first element and at least a portion of the first surface of the second element such that a portion of the dielectric layer extends between the first surface of the first element and the first surface of the second element and such that the deformable second support layer is pressed into the space between the first element and the second element,
   removing the deformable first support layer after the dielectric layer is laminated onto at least a portion of the first element and onto at least a portion of the second element, and
   depositing an electrically conductive layer onto the upper surface of the free-standing dielectric layer, the electrically conductive layer extending between and electrically connecting the first electrically conductive surface and the second electrically conductive surface.

14. A method according to claim 13, wherein
the electrically conductive layer provides a plurality of electrically conductive tracks on the upper surface of the dielectric layer.

15. A method according to claim 14, wherein
the plurality of electrically conductive tracks are produced by selective deposition.

16. A method according to claim 14, wherein
the plurality of electrically conductive tracks are produced by depositing an electrically conductive layer and structuring the electrically conductive layer.

17. A method of manufacturing an electronic component, comprising:
   providing at least one semiconductor power transistor, wherein the semiconductor power transistor comprises a first surface comprising at least one load electrode and a second surface which opposes the first surface;
   providing a leadframe comprising a first surface and a second surface which opposes the first surface, wherein the leadframe comprises at least one die pad and at least one lead, wherein the lead comprises a second electrically conductive surface and wherein the lead and is positioned separate from, and spaced at a distance from, the die pad;
   providing a free-standing dielectric layer having a lateral extent greater in at least one direction than the distance between the first load electrode and the second electrically conductive surface of the lead;
   mounting the second surface of the first semiconductor power transistor on the die pad;
   arranging a deformable first support layer below the second surface of the die pad and the second surface of the lead;
   arranging the free-standing dielectric layer above the first load electrode of the semiconductor power transistor and above the second electrically conductive surface of the lead;
   laminating the free-standing dielectric layer onto at least the first surface of the semiconductor power transistor and the first surface of the lead such that a portion of the dielectric layer extends between the first surface of the semiconductor power transistor and the first surface of the lead and such that the deformable second support layer is pressed into the space between the first semiconductor power transistor and the lead; wherein at least a portion of the first load electrode and at least a portion of the second electrically conductive surface of the lead remain exposed from the dielectric layer;
   removing the deformable first support layer after the dielectric layer is laminated onto at least a portion of the first element and onto at least a portion of the second element;
   depositing an electrically conductive layer onto the upper surface of the free-standing dielectric layer, the electrically conductive layer extending between and electrically connecting the first load electrode of the semiconductor power transistor and the lead of the leadframe, and
   embedding the semiconductor power transistor and the lead in a plastic encapsulation mass so that the lower surface of the portion of the dielectric layer extending between the semiconductor power transistor and the lead is embedded in the plastic encapsulation mass.

18. A method according to claim 17, wherein
the electrically conductive layer provides a plurality of electrically conductive tracks on the upper surface of the dielectric layer.

19. A method according to claim 17, wherein
two semiconductor power transistors are provided, each having a first surface comprising at least one load electrode and a second surface which opposes the first surface, wherein the dielectric layer is laminated onto at least portion of the first surface of the two semiconductor power transistors and wherein the electrically conductive layer is structured to electrically connect the two semiconductor power transistors and to provide a half-bridge circuit.

20. A method according to claim 19, wherein
at least one further semiconductor chip is provided, the semiconductor chip having a first surface comprising a plurality of contact pads and a second surface which opposes the first surface, wherein the dielectric layer is laminated onto at least portions of the first surface of the semiconductor chip and wherein the electrically conductive layer is structured so as to provide electrically conductive tracks between the contact pads of the semiconductor chip and at least one of a control electrode of the semiconductor power transistor and a lead of the leadframe.

21. A method according to claim 18, wherein the plurality of electrically conductive tracks are produced by selective deposition.

22. A method according to claim 18, wherein the plurality of electrically conductive tracks are produced by depositing an electrically conductive layer and structuring the electrically conductive layer.

23. A method according to claim 17, wherein one or more of a vacuum and heat are applied during the lamination of the dielectric layer onto the at least one semiconductor power transistor and the at least one lead.

* * * * *